United States Patent
Efland et al.

(10) Patent No.: US 7,135,759 B2
(45) Date of Patent: Nov. 14, 2006

(54) INDIVIDUALIZED LOW PARASITIC POWER DISTRIBUTION LINES DEPOSITED OVER ACTIVE INTEGRATED CIRCUITS

(75) Inventors: Taylor R. Efland, Richardson, TX (US); Milton L. Buschbom, Plano, TX (US); Sameer Pendharkar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 621 days.

(21) Appl. No.: 10/039,663

(22) Filed: Oct. 22, 2001

(65) Prior Publication Data
US 2002/0084516 A1    Jul. 4, 2002

Related U.S. Application Data

(60) Provisional application No. 60/243,932, filed on Oct. 27, 2000.

(51) Int. Cl.
*H01L 23/495*    (2006.01)

(52) U.S. Cl. ............. 257/676; 257/672; 257/781; 257/784; 257/691

(58) Field of Classification Search ............. 257/207, 257/208, 209, 691, 661
See application file for complete search history.

(56) References Cited

U.S. PATENT DOCUMENTS 5,468,993 A * 11/1995 Tani ..................... 257/676
5,973,554 A * 10/1999 Yamasaki et al. ........... 327/564

OTHER PUBLICATIONS

Wolf et al., Silicon Processing for the VLSI Era, Lattice Press, vol. 1, pp. 857-858.*

* cited by examiner

*Primary Examiner*—Leonardo Andujar
(74) *Attorney, Agent, or Firm*—Yingsheng Tung; Wade James Brady, III; Frederick J. Telecky, Jr.

(57) ABSTRACT

An integrated circuit (IC) chip, mounted on a leadframe, has a network of power distribution lines deposited on the surface of the chip so that these lines are located over active components of the IC, connected vertically by metal-filled vias to selected active components below the lines, and also by conductors to segments of the leadframe. Furthermore, the lines are fabricated with a sheet resistance of less than 1.5 m$\Omega$/□ and the majority of the lines is patterned as straight lines between the vias and the conductors, respectively.

26 Claims, 5 Drawing Sheets

INDIVIDUALIZED LOW PARASITIC POWER DISTRIBUTION LINES DEPOSITED OVER ACTIVE INTEGRATED CIRCUITS

This application claims priority under 35 USC § 119 based upon Provisional Patent Application No. 60/243,932 filed Oct. 27, 2000.

FIELD OF THE INVENTION

The present invention is related in general to the field of semiconductor devices and processes, and more specifically to integrated circuits that enable individualized power distribution through connectors deposited on the chip surface over active circuit components.

DESCRIPTION OF THE RELATED ART

The leadframe for semiconductor devices was invented (U.S. Pat. Nos. 3,716,764 and 4,034,027) as a pre-fabricated, low-cost part to serve several needs of semiconductor devices and their operation simultaneously: First of all, the leadframe provides a stable support pad for firmly positioning the semiconductor chip, usually an integrated circuit (IC) chip. Since the leadframe including the pad is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the bond pads on the IC surface are typically bridged by thin metallic wires, individually bonded to the IC bond pads and the leadframe segments. As a consequence of this solution, the segments, bond pads and connecting wires have fixed relative locations, once the device design has been finalized, and the bond pads cannot be rearranged at convenience in order to facilitate some IC re-layout.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering.

It has been common practice to manufacture single piece leadframes from thin (about 120 to 250 μm) sheets of metal. For reasons of easy manufacturing, the commonly selected starting metals are copper, copper alloys, iron-nickel alloys (for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

It has further been common practice to dedicate a plurality of segments for carrying the electrical signals to designated chip inputs/outputs, and dedicate another plurality of segments for supplying the power currents to designated chip inputs/outputs.

Two independent trends in semiconductor technology, both with a long history, contribute to the urgency for the present invention. The first technology trend concerns the rapidly growing demand for more and more chip signal and power terminals and thus leadframe segments. Leadframes of ever finer segment dimensions have been introduced. However, they simply have been overwhelmed by the even more rapidly growing demand for more and more numerous and closely spaced bond pads on the chip. This trend causes ever tighter constraints on all bond and wire dimensions combined with extremely tight accuracy requirements for attaching the ball bond and stitch bond welds. This trend is now pushing against the limits of technical feasibility.

The second technology trend concerns manufacturing cost savings by conserving semiconductor "real estate". In order to accommodate balls of bonding wires or solder, typical bond pads on silicon ICs have to be of sufficient size; they typically range from squares of 45×45 μm to squares of 150×150 μm. They consume, therefore, an area between approximately 1 and 20%, sometimes up to 45%, of the circuit area, dependent on the number of bonding pads and the size of the IC. For manufacturing and assembly reasons, the bond pads are arranged in rows along the periphery of the circuit, usually stringed along all four chip sides.

Until now, most semiconductor devices manufactured had to exclude the area covered by the bond pads from use for laying out actual circuit patterns because of the high risk of damaging the circuit structures due to the unavoidable mechanical forces and metallurgical stresses needed in the bonding process. Evidently, considerable savings of silicon real estate can be obtained if circuit patterns could be placed under the bond pad metal. One way to achieve this feature would be to create another level of metallization dedicated primarily to bond pad formation. This level would be built over a protective overcoat covering an active circuit area. In existing technology, however, a special stress buffer layer of expensive polyimide has to be applied between the protective overcoat and the extra metal layer, as shown by K. G. Heinen et al. ("Wire Bonds over Active Circuits", Proc. IEEE 44th Elect. Comp. Tech. Conf., 1994, pp. 922–928).

A different approach in existing technology has been proposed in U.S. patent application Ser. No. 60/092,961, filed Jul. 14, 1998 (Saran, "System and Method for Bonding Over Active Integrated Circuits"). In order to make the bonding pads strong enough to withstand the mechanical forces required in the wire bonding process, reinforcing systems under the bonding pad are described which utilize specific portions of the actual IC as the means to reinforce weak dielectric layers under the bond pad. This method requires specific design or redesign of the IC and is poorly suited for standard linear and logic ICs which often have numerous bond pads but relatively small circuit areas.

Another approach to forming bonds over active circuit portions is described in U.S. patent application Ser. No. 08/959,410, filed on Oct. 28, 1997, U.S. patent application Ser. No. 09/611,623, filed on Jul. 7, 2000 (Shen et al., "Integrated Circuit with Bonding Layer over Active Circuitry"), and U.S. patent application Ser. No. 60/221,051, filed on Jul. 27, 200 (Efland et al., "Integrated Power Circuits with Distributed Bonding and Current Flow"). The present invention is related to both of these patent applications. Vias to the top metallization layer of the circuit are coated with seed metal and then plated with successive metal layers, thereby filling the vias and forming stress-absorbing attachment surfaces for wire bonds or solder balls.

Another approach to forming bonds over active circuit portions is described in U.S. patent application Ser. No. 09/458,593, filed on Dec. 10, 1999 (Zuniga et al., "System and Method for Bonding over Integrated Circuits"), to which the present invention is related. A combination of bondable and stress-absorbing metal layers, and a mechanically strong, electrically insulating layer separate a bond pad and a portion of the integrated circuit located under the bond pad.

A number of U.S. Patents describe prefabricated leadframes attached to the active surface of ICs so that a common power bus can have a plurality of horizontal wire bonds to individual IC bond pads aligned in a center row of the chip. Examples of these "lead-over-chip" structures, mostly for DRAM MOS devices, can be found in U.S. Pat. No. 5,994,169, issued Nov. 30, 1999 (Lamson et al., "Leadframe for Integrated Circuits and Process of Packaging"); U.S. Pat. No. 5,840,599, issued Nov. 24, 1998 (Lamson et al., "Process of Packaging an Integrated Circuit with a Conductive Material between a Leadframe and the Face of the Circuit"); U.S. Pat. No. 5,432,127, issued Jul. 11, 1995 (Lamson et al., Method for Making a Balanced Capacitance Leadframe for Integrated Circuits having a Power Bus and Dummy Leads"); U.S. Pat. No. 5,233,220, issued Aug. 3, 1993 (Lamson et al., "Balanced Capacitance Leadframe for Integrated Circuits and Integrated Circuit Device with Separate Conductive Layer"); U.S. Pat. No. 5,083,187, issued Jan. 21, 1992 (Lamson et al., "Integrated Circuit Device having Bumped Power Supply Buses over Active Surface Areas and Method of Manufacture thereof").

In the recent U.S. patent application Ser. No. 09/975,630, filed on Oct. 12, 2001 (Taylor R. Efland "Circuit Structure Integrating the Power Distribution Functions of Circuits and Leadframes into the Chip Surface") [(Efland, TI-31678)], an integrated circuit (IC) chip is described, which is mounted on a leadframe and has a network of power distribution lines deposited on the surface of the chip so that these lines are located over active components of the IC. The lines are connected vertically by metal-filled vias to selected active IC components below the lines, and also by conductors to segments of the leadframe. The present invention is related to this disclosure.

The quoted disclosure, however, does not consider any impact on device characteristics of the additional power distribution network, or any potential methods for improving the electrical device performance. An urgent need has therefore arisen for a low-cost, reliable structure and method combining significant improvements of IC characteristics with savings of silicon real estate, relaxed manufacturability of wire and solder ball bonding and leadframe designs, and freedom for IC layout. The system should provide individualized low parasitic power distribution for large and diversified families of high-performance semiconductor products. The system and method should be applicable to a wide spectrum of design, material and process variations, leading to improved device characteristics, process yield and product reliability, as well as significant savings of silicon. Preferably; these innovations should be accomplished using the installed process and equipment base so that no investment in new manufacturing machines is needed.

SUMMARY OF THE INVENTION

An integrated circuit (IC) chip, mounted on a leadframe, has a network of power distribution lines deposited on the surface of the chip so that these lines are located over active components of the IC, connected vertically by metal-filled vias to selected active components below the lines, and also by conductors to segments of the leadframe. Furthermore, the lines are fabricated with a sheet resistance of less than 1.5 m$\Omega$/□ and the majority of the lines is patterned as straight lines between the vias and the conductors, respectively. Consequently, this network provides a number of electrical advantages:

The distance is minimized for power delivery between a selected segment and one or more corresponding active components, to which the power is to be delivered.

Parasitic electrical losses are minimized in power delivery between a selected segment and one or more corresponding active components, to which the power is to be delivered.

These minimized parasitic electrical losses include voltage drops during the power current flow, capacitances between the network of lines and the active components, and inductances between the network lines.

In a preferred embodiment of the invention, the chip of a semiconductor device has an integrated circuit fabricated on the first chip surface; the circuit comprises active components, at least one metal layer, and a protection by a mechanically strong, electrically insulating overcoat which has a plurality of metal-filled vias to contact said at least one metal layer, and a plurality of windows to expose circuit contact pads. The chip further has a stack of electrically conductive films deposited on the overcoat; the films are patterned into a network of lines substantially vertically over the active components. The stack has a bottom-most film in contact with the vias, at least one stress-absorbing film, and an outermost film which is non-corrodible and metallurgically attachable. The network is patterned to distribute power current and ground potential. The second chip surface is attached to the mount pad of a leadframe. The leadframe also has a first plurality of segments providing electrical signals, and a second plurality of segments providing electrical power and ground. Electrical conductors are connecting the chip contact pads with said the plurality of segments, and electrical conductors are connecting the network lines with the second plurality of segments.

It is an aspect of the present invention to reduce the cost of IC chips by reducing the silicon areas consumed by the circuit power distribution lines, as well as by the chip contact pads for power connections.

It is an aspect of the present invention to gain a new degree of circuit design flexibility by enabling the power connection to active components in geometrically shortest path and at no penalty for redesign.

Another aspect of the invention is to improve the IC high speed performance by minimizing the RC time constant in power current flow through minimizing parasitic resistances in power supply lines.

Another aspect of the invention is to improve assembly manufacturability by relaxing the tight placement rules for ball attachment in wire bonding and solder bonding.

Another aspect of the invention is to reduce the number of leadframe segments required for power input/output by delegating the majority of the power distribution function of leadframes to the innovative network of power distribution lines positioned on the chip surface.

Another aspect of the invention is to reduce the cost of IC chips by reducing the silicon areas consumed by the circuit power distribution lines, as well as by the chip contact pads for power connections.

Another aspect of the present invention is to advance the process and operation reliability of semiconductor probing, and wire bonded and solder-attached assemblies by providing the pad metal layers, and insulating layers separating the contact pad and the circuit, in thicknesses sufficient to reliably absorb mechanical, thermal and impact stresses.

Another aspect of the invention is to eliminate restrictions on the processes of probing and of wire bonding and solder attachment, thus minimizing the risks of inflicting cracking damage even to very brittle circuit dielectrics.

Another aspect of the invention is to provide design and layout concepts and process methods which are flexible so that they can be applied to many families of semiconductor IC products, and are general, so that they can be applied to several generations of products.

Another aspect of the invention is to use only design and processes most commonly used and accepted in the fabrication of IC devices, thus avoiding the cost of new capital investment and using the installed fabrication equipment base.

These aspects have been achieved by the teachings of the invention concerning design concepts and process flow suitable for mass production. Various modifications have been successfully employed to satisfy different selections of product geometries and materials.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent applications Ser. No. 08/959,410, filed on Oct. 28, 1997, U.S. patent application Ser. No. 09/611,623, filed on Jul. 07, 2000 (Shen et al., "Integrated Circuit with Bonding Layer over Active Circuitry"), U.S. patent application 60/221,051, filed on Jul. 27, 2000 (Efland et al., "Integrated Power Circuits with Distributed Bonding and Current Flow"), and U.S. patent application Ser. No. 09/975,630, filed on Oct. 12, 2001 (Taylor R. Efland, "Circuit Structure Integrating the Power Distribution Functions of Circuits and Leadframes into the Chip Surface"), which are herewith incorporated by reference.

Figure 1:
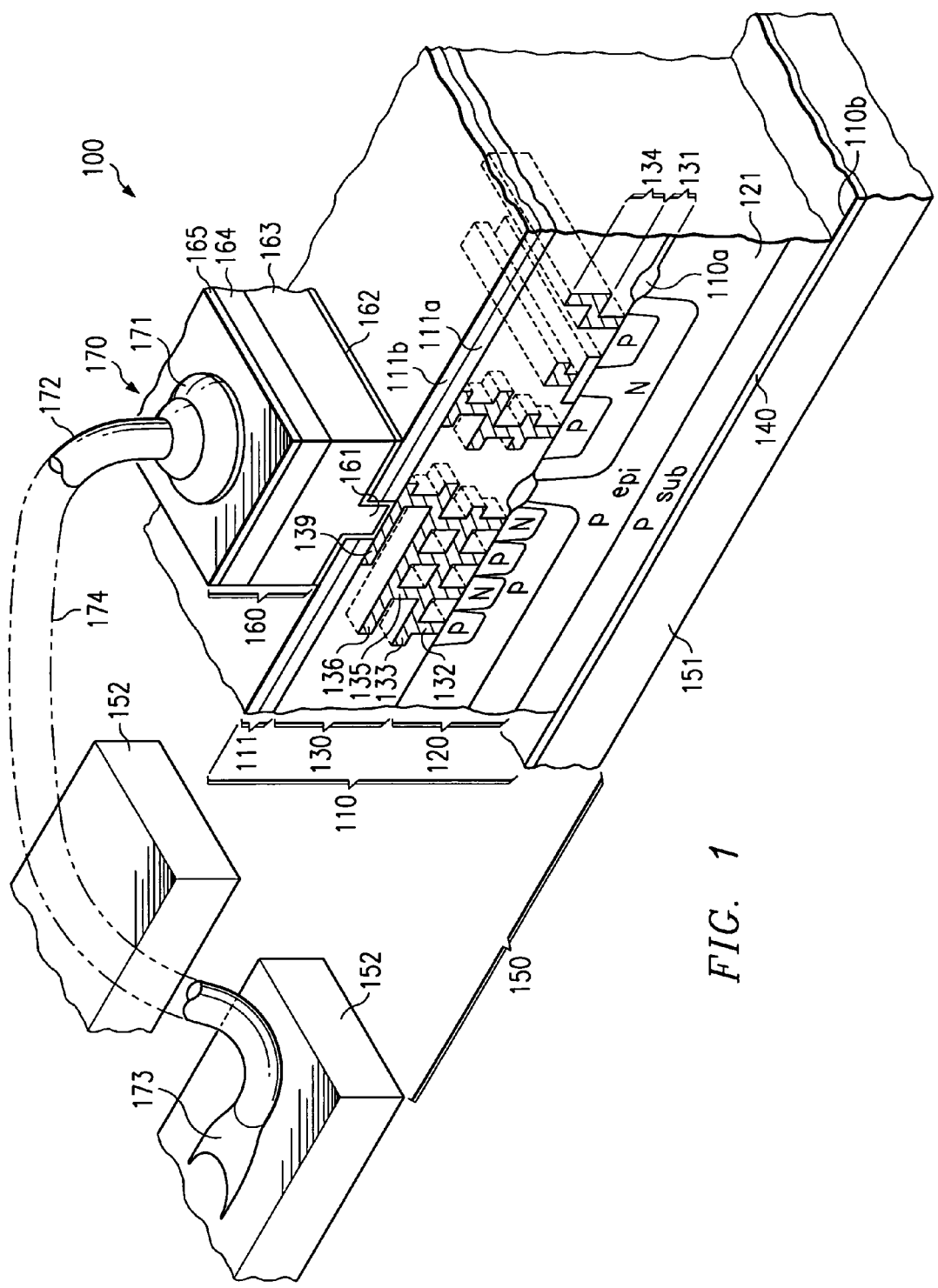
FIG. 1 is a simplified perspective and cross sectional view of a power distribution line over an integrated circuit (IC) fabricated in a semiconductor chip attached to a leadframe mount pad, with an electrical conductor connecting to a leadframe segment, according to an embodiment of the invention.

FIG. 1 illustrates schematically a preferred embodiment, generally designated 100, of the present invention, providing an individualized low parasitic power distribution line deposited over a portion of an active integrated circuit (IC). FIG. 1 shows a portion of an IC chip 110, which has a first ("active") surface 110a and a second ("passive") surface 110b. The second chip surface 110b is mechanically attached by adhesive material 140 to the chip mount pad 151 of a pre-fabricated metallic leadframe 150. Leadframe 150 further has a plurality of segments 152, which serve as electrical leads to outside parts.

FIG. 1 shows a small portion of an IC fabricated into and on top of the first chip surface 110a. Generally, the IC has active components 120, a plurality of metal layers 130, and a mechanically strong, electrically insulating (and usually moisture-impenetrable) protective overcoat 111. As an example, the IC 130 comprises a plurality of lateral DMOS transistors fabricated in p-epitaxial layer 121. The lateral DMOS transistors could be manufactured using the lateral DMOS process described in U.S. Pat. No. 5,272,098, which is hereby incorporated by reference. Alternatively, lateral DMOS transistor 400 could be manufactured according to the methods described in U.S. Pat. Nos. 5,242,841 or 5,306,652, which are hereby incorporated by reference.

Subsequently to the steps necessary to fabricate elements of lateral DMOS transistors into surface 110a described above, a multilevel interconnection hierarchy is constructed on top of surface 110a. The construction starts with the deposition of an interlevel insulator layer 131. Insulator 131 is then patterned and etched to form vias 132, using standard photolithographic techniques. Metallization layer 133 is deposited over insulator layer 131 and into vias 132 and patterned and etched. Metal layer 133 is sometimes referred to as "metal 1".

Pure or alloyed aluminum, between 0.4 and 1.5 µm thick, is the most frequently selected material for metallization. Copper, embedded in a refractory metal layer, is becoming more common. For power lines, the aluminum layer width ranges from about 20 to 250 µm. Consequently, the dense network of power lines required for large IC's consumes considerable "real estate".

A second interlevel insulator layer 134 is then deposited over metallization layer 133 and patterned and etched to form vias 135 therein. Next, metallization layer 136 is deposited over insulator layer 134 and into vias 135 and patterned and etched. Metal layer 136 is sometimes referred to as "metal 2". Dependent on the device type, the deposition and patterning steps may be repeated several more times; in FIG. 1, there is one more repetition. The final insulator is overcoat layer 111 mentioned above.

Insulator layers 131 and 134 may be formed from a nitride, oxide, nitride/oxide combination, SOG, BPSG, or low-k gel, for example. Typically metallization layers 133 and 136 are aluminum, although other metals such as copper or metal alloys could also be used. Although three metallization layers 133, 136, and 139 are shown in FIG. 1, it is understood that a single metallization layer or more than three metallization layers could be used.

Next, a protective overcoat layer 111 is deposited on the surface of the semiconductor wafer, uniformly covering the last metallization layer 139. Overcoat layer 111 may be made from standard electrically non-conductive material, or it may be moisture impenetrable and able to protect metallization layer 139 during subsequent fabrication. Examples of suitable materials are silicon nitride, silicon oxynitride, silicon carbon alloys, oxide/nitride combinations, polyimide, and sandwiched films thereof. The thickness may range from about 400 to 1500 nm. For some chip fabrication processes, it may be advantageous to flatten the silicon nitride 111a by an additional spin-on glass layer 111b.

Using standard photolithographic techniques, vias 161 are formed through the overcoat layer (or layers) 111 to expose the metallization layer intended for serving power current or electrical ground potential in the IC. In FIG. 1, via 161 is shown to expose metallization layer 139.

The next process steps comprise the deposition and patterning of power distribution lines 160. Lines 160 could be manufactured using the process described in above quoted U.S. patent application Ser. No. 09/611,623, which is hereby incorporated by reference. Metals, thicknesses and widths of lines 160 are configured such that the electrical resistance for any current will be small; a preferred design goal is a sheet resistance of less than 1.5 m$\Omega$/□, typically 1.3 m$\Omega$/□. For reducing the electrical resistance of power current still more, it may further be advantageous to position via 161 approximately vertically over the vias of lower metallization layers in order to reach the active IC components in the shortest possible way. In the example of FIG. 1, the opening is positioned vertically over at least one via 135 and 132 connecting to one of the DMOS transistors.

Via 161 is filled with the first metal layer 162 of the layers forming stack 160. Stack 160 consists of a seed metal layer 162, a first stress-absorbing metal layer 163, a second stress absorbing layer 164 and an outermost bondable (and/or solderable) metal layer 165. Seed metal layer 162 is selected from a group consisting of tungsten, titanium, titanium nitride, molybdenum, chromium, and alloys thereof. The seed metal layer is electrically conductive, provides adhesion to both the metal 139 and the protective overcoat, permits the exposed portions of its upper surface to be electroplated, and prevents migration of the subsequent stress-absorbing metals to the bus metallization layers. The thickness of seed metal layer 162 is between about 100 and 500 nm. Alternatively, the seed metal layer 162 may be composed of two metal layers; an example for the second metal is copper, since it provides a suitable surface for subsequent electroplating.

It should be pointed out for the present invention that a single seed layer can preferably be made of refractory metal which has a thickness large enough to reliably act as a stress-absorbing buffer. Thicknesses between about 200 and 500 nm, preferably about 300 nm, are satisfactory. The thickness for optimum stress absorption depends not only on the selected metal, but also on the deposition technique selected, the rate of deposition, and the temperature of the silicon substrate during the time of deposition, since these parameters determine the microcrystallinity of the deposited layer. It has been found, for instance, that when using sputter deposition of tungsten, the layer formation is preferably performed at a rate of about 4 to 5 nm/s onto a silicon substrate at ambient temperature, increasing to about 70° C. when a thickness of at least 300 nm is reached. The tungsten microcrystals thus created have an average size and distribution such that they act reliably as stress-absorbing "springs" during the wire bonding process in assembly.

For depositing the (thicker) stress-absorbing layers 163 and 164, it is advantageous to employ an electroplating process. An example for the first stress-absorbing metal layer 163 is copper. Its thickness in the range from about 2 to 35 μm makes it a mechanically strong support layer for subsequent attachment of connecting members such as bonding wires. An example for the second stress-absorbing metal layer 164 is nickel in the thickness range from bout 1 to 5 μm.

The outermost layer 165 is metallurgically bondable and/or solderable. If wire bonding is the connecting method selected and layer 165 should be bondable, favorable metal choices include pure or alloyed aluminum, gold, palladium, and silver. If soldering is the connecting method selected and layer 165 should be solderable, favorable metal choices include palladium, gold, silver and platinum. In both cases, the thickness is in the 500 to 2800 nm range. It is understood that the number of layers, the choice of materials and their thicknesses, and the deposition processes can be varied in order to suit specific device needs.

If outermost layer 165 is selected so that it is solderable, a solder ball (700 in FIG. 7) can be attached to it by standard reflow techniques. However, it was described in the abovecited U.S. patent application Ser. No. 09/611,623 that it is often advisable to employ an additional solder mask 702 or polyimide layer with an opening 704 for each solder ball. This technique keeps the flip-chip bump in a defined area and shape during bump formation and subsequent attachment to an external package or board.

Electrical conductors connect this outermost metal with the segment tips of the leadframe. In FIG. 1, wire bonding (the wire 172 is preferably pure or alloyed gold, copper, or aluminum with a diameter of about 20 to 30 μm) is chosen as the preferred technique for electrical interconnection. Nailhead-shaped ball 171 is attached to the distribution line, and stitch 173 is attached to segment tip 152. It is important for the present invention that recent technical advances in wire bonding now allow the formation of tightly controlled wire loops 174 and loop shapes. By way of example, loop 174 may be more elongated than shown in FIG. 1. Wire lengths of 7.5 mm or even more are achievable with today's bonders. Such advances can, for instance, be found in the computerized bonder 8020 by Kulicke & Soffa, Willow Grove, Pa., U.S.A., or in the ABACUS SA by Texas Instruments, Dallas, Tex., U.S.A. Moving the capillary in a predetermined and computer-controlled manner through the air will create a wire looping of exactly defined shape. For instance, rounded, trapezoidal, linear and customized loop paths can be formed. In general, though, it is advisable to keep the length of the wire span 174 to 2.5 mm or less in order to avoid risks of wire sagging or wire sweep (during the package molding process).

Figure 8:
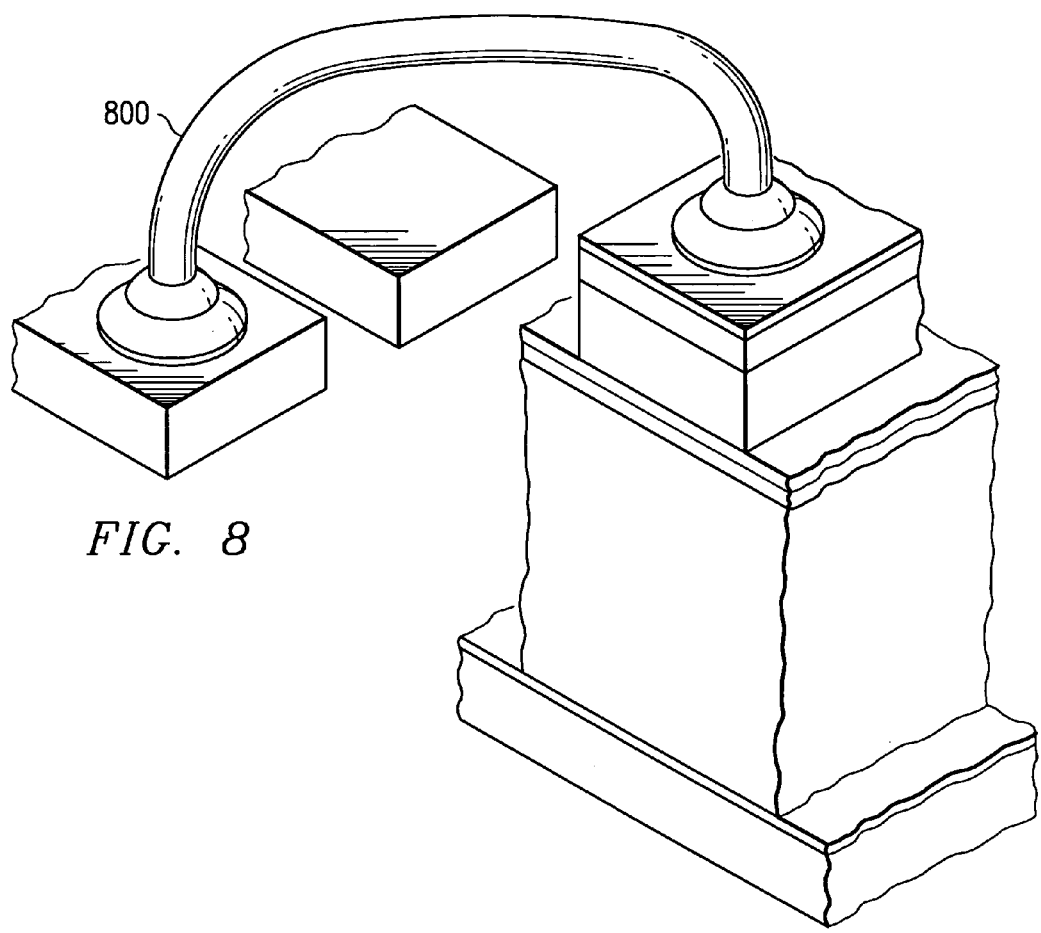
FIG. 8 is a simplified perspective and cross sectional view of a power distribution line over an integrated circuit (IC) fabricated in a semiconductor chip with a ribbon connecting the distribution line to a leadframe segment.

Outermost metal layer 165 is equally well suited for wedge bonding, involving ribbons (800 in FIG. 8).

Figure 7:
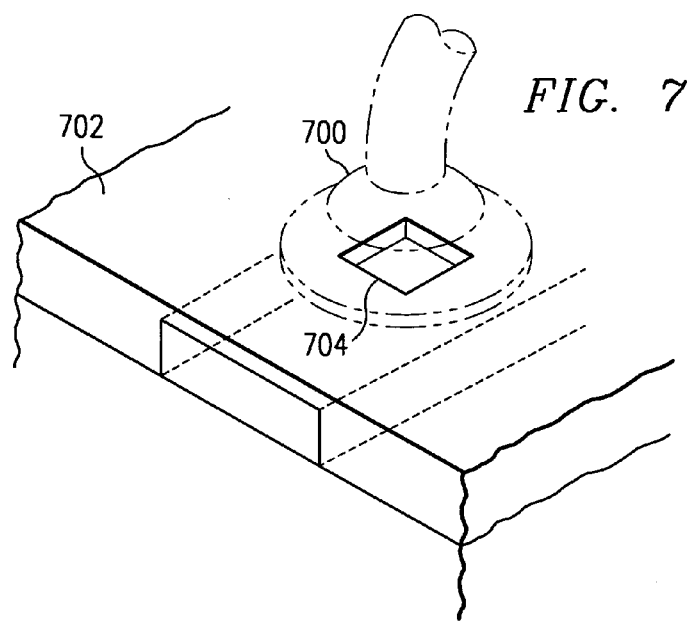
FIG. 7 is a simplified perspective and cross sectional view of a power distribution line over an integrated circuit (IC) fabricated in a semiconductor chip with a solder ball mounted to the distribution line through an opening in a solder mask layer.

The plating pattern of the power distribution lines may form any desired layout (as illustrated, for example, in FIG. 7). The preferred pattern, however, is to have the majority of lines formed as straight lines between vias such as via 161 in FIG. 1 and the conductor 170 connecting to leadframe segments 152, thereby minimizing the distance and thus the electrical resistance between a selected segment 152 and a corresponding active IC component, to which power has to be delivered.

Figure 2:
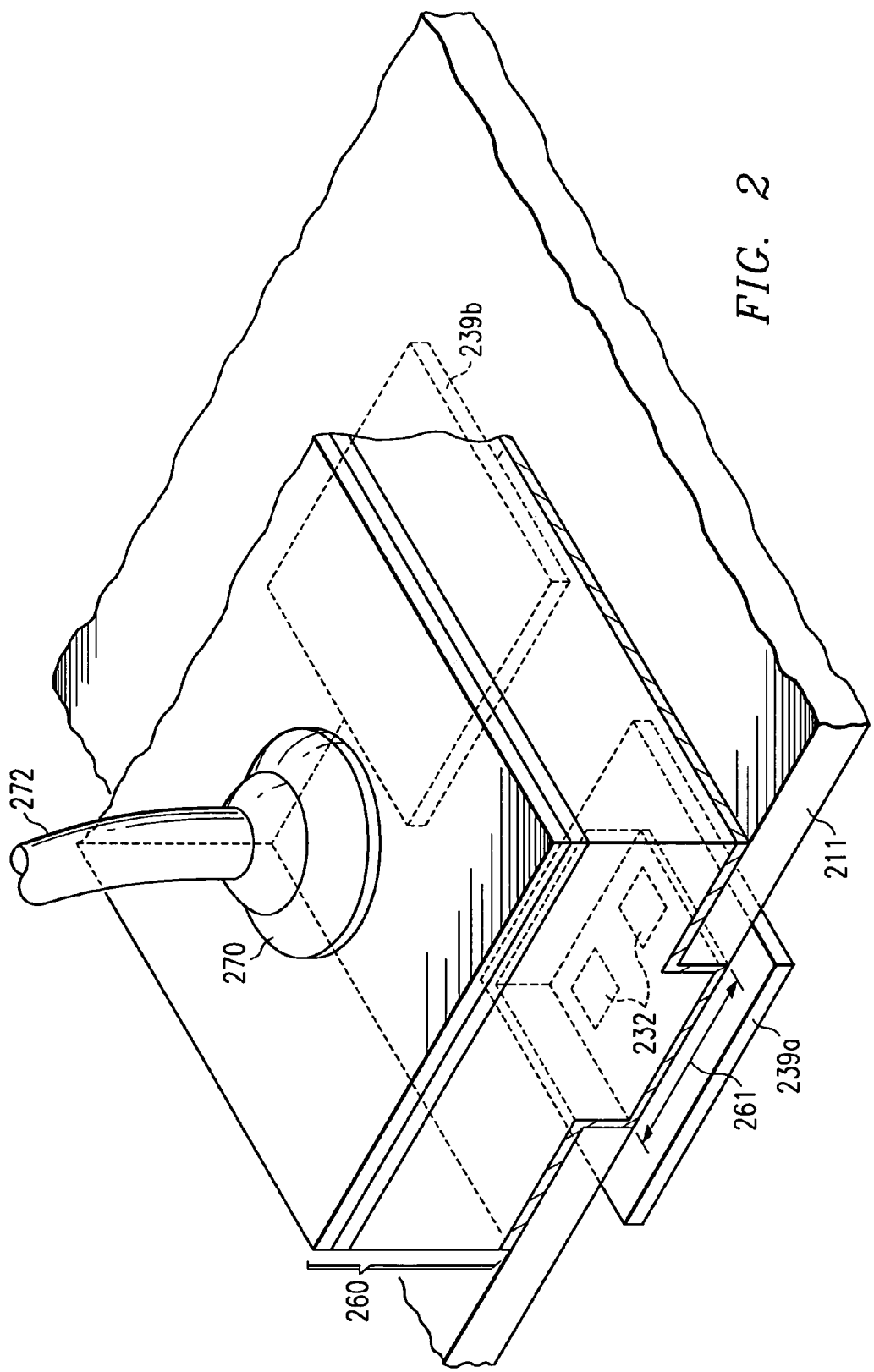
FIG. 2 is a simplified perspective and cross sectional view of a portion of a power distribution line, with connecting member attached, according to a preferred embodiment of the invention.

In some circuit configurations, the electrical resistance may be further reduced when the distribution line feeds into a wider opening rather than a simple via. This electrical aspect of the invention is illustrated in FIG. 2. A relatively wide opening 261 is opened in the mechanically strong, electrically insulating overcoat 211. The opening is filled by the metal sequence 260 of the distribution line, analogous to FIG. 1. It is important for the present invention that opening 261 is in contact with a bus metal layer 239a which, in turn, is located vertically over a plurality of conducting vias 232 connected to active circuit components below. Because of the low sheet resistance of the layer stack 260 forming the distribution line, the ball (nailhead) bond 270 of wire 272 can supply electrical current to vias 232 at minimum electrical resistance.

The metallization of the distribution line extends geometrically beyond the direct area of the opening 261. In the example of FIG. 2, the line extends over an adjacent yet separate metallization 239b. This metallization may again be in contact with a plurality of conducting vias (not shown in FIG. 2) leading to active IC components.

The thickness and dielectric constant of the protective overcoat layer 211 (in FIG. 1, designated 111) ensures low parasitic capacitances between the distribution lines fabricated and patterned as indicated in FIGS. 1 and 2 and corresponding active IC components. Due further to the low sheet resistance of the distribution lines, power current flow can thus be supplied to the active components with minimum parasitic electrical losses.

The invention can be applied to a wide variety of different IC devices, designs, fabrication processes, metallization systems, and technologies. Selected examples are compiled in Tables 1 and 2. However, persons skilled in the art will realize that the invention is not limited to the examples given in Tables 1 and 2.

TABLE 1

Examples of IC Metallization Layer Systems

| PROCESSES | CONDUCTIVE LAYERS | BARRIERS | INTERLEVEL DIELECTRICS | SILICIDE SALICIDE |
|---|---|---|---|---|
| SOG Planar | Up to 10 | Tungsten | Low k gel | Cobalt |
| CMP Planar | Aluminum sputter | Titanium | SiO$_2$ | Platinum |
| Sputter | Copper | Cobalt | BPSG | Titanium |
| Trench | Alloys | | SOG | |
| Plugs | Poly-silicon | | Si3N4, oxy nitride | |
| Damascene | | | TaO | |
| Dual Damascene | | | | |
| Side walls | | | | |
| LOCOS | | | | |

TABLE 2

Semiconductor Integrated Circuit Technologies

| PROCESSES | DEVICES | INTEGRATED CIRCUIT BLOCKS |
|---|---|---|
| LOCOS | ESD CMOS | CMOS Core; DSP (RF Circuits) |
| Trench Poly Fill | Bipolar | Microprocessor (BBA) |
| Trench Oxide Fill | HBT | A/D-D/A (CAP com) |
| Trench Oxide Fill | Capacitor Storage Cell | Memory (PMP) |
| Trench Metal Fill | Resistors | Charge Pump (Computer Peripherals) |
| Silicon | Capacitors | ESD (Anything) |
| | LDMOS/VDMOS | Power Device |
| Germanium | DE-CMOS | Bandgap |
| SOI/Box | Varistors | Thermal/Sense |
| STI | Inductors | Overvoltage |
| Epitaxial | IGBT | Lock out |
| | MCT | |

Figure 3:
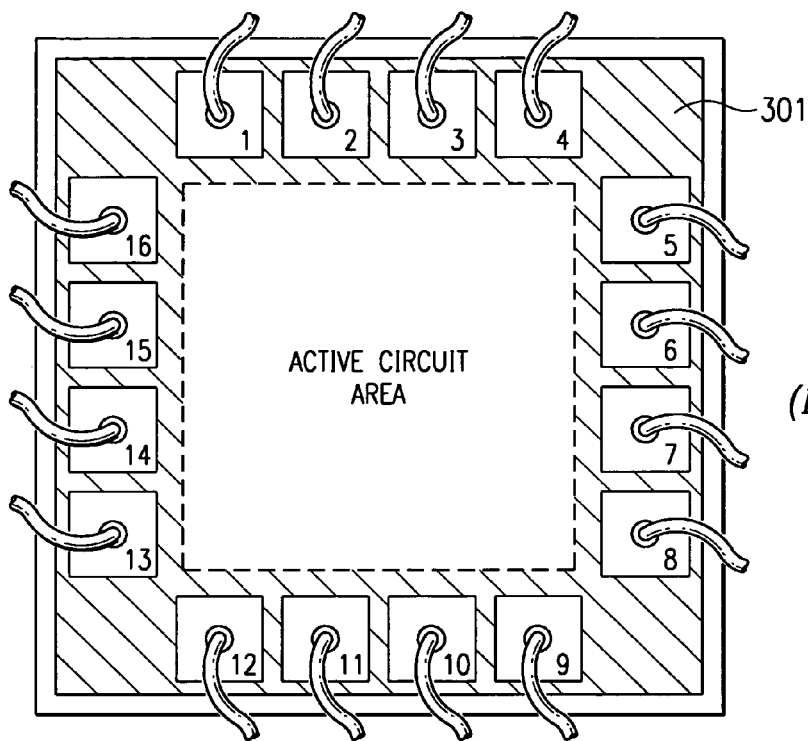
FIG. 3 is a schematic top view of an IC indicating the positioning of contact pads according to known technology.
Figure 4:
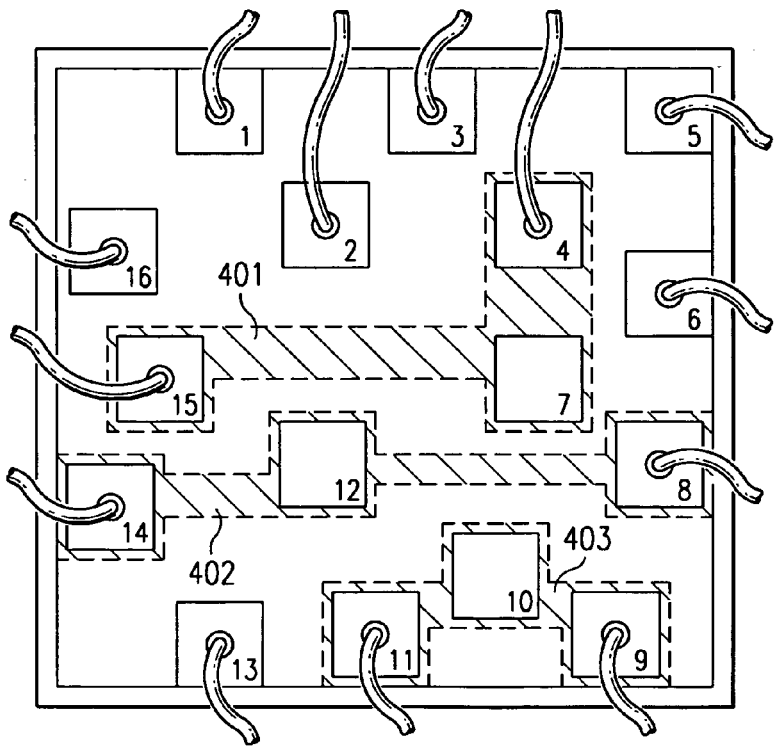
FIG. 4 illustrates schematically the positioning of contact pads, with emphasis on morphing a plurality of power supply contact pads into a power distribution line, according to an embodiment of the invention.

In addition to the flexibility relative to device families and fabrication technologies, illustrated in Tables 1 and 2, another significant general advantage of the present invention is indicated by the comparison of FIGS. 3 and 4. By way of example, both Figures are schematic, simplified top views of an IC chip having a fixed number (16) of contact pads. FIG. 3 depicts these contact pads arranged in positions according to known technology, FIG. 4 depicts the same fixed number (16) of pads according to this invention. As defined herein, the contact pads of an IC refer to the input/output (I/O) terminals of the IC, specifically to the metallized I/Os of the circuit. When wire bonding is used in the assembly of the IC chips, these pads are referred to as "bond pads". In FIG. 3 (known technology), the bond pads are aligned close to the chip periphery, more or less in linear arrays around the central active IC area, in order to keep the length of connecting bonding wires to the "outside world" short. As a consequence of this arrangement, the bond pads consume the large area 301 of "silicon real estate", marked by shading in FIG. 3. Dependent on device type, area 301 can amount from a few percent to more than 50% of the overall chip area.

In FIG. 4 (this invention), all bond pads are placed over active IC area. As a consequence of this arrangement, a substantial amount of silicon real estate is saved. In addition, a number of contact pads, which supply power current to the active IC, are combined into several power distribution lines (marked by different shading in FIG. 4). These lines are preferably patterned as approximately straight lines, but may have variable widths at various locations. For instance, they may widen at certain locations to facilitate the attachment of ball bonds or solder balls. Furthermore, some line may make several contact pads superfluous, which were originally needed in the arrangement of FIG. 3. For example, power distribution line 401 absorbs contact pad# 7; line 402 absorbs contact pad# 12; and line 403 absorbs contact# 10. Consequently, there are now 3 wire bonds fewer needed in the arrangement of FIG. 4 compared to the arrangement of FIG. 3 (and thus 3 fewer segments and leads of the leadframe).

FIG. 4 illustrates an additional electrical advantage of the present invention. The network of the power distribution lines can be patterned so that parasitic inductances between the network lines are minimized. As further stated above, the selection of the materials and thicknesses for the IC insulating layers provides minimum parasitic capacitances between the distribution lines and the active IC components. In summary, when the power distribution lines, positioned over the active IC, are individualized for the specific device, parasitic electrical losses can be minimized.

Figure 5A:
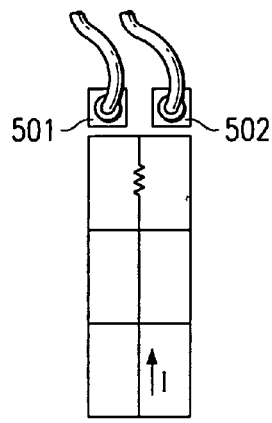
FIG. 5A is a schematic and simplified top view of a portion of an IC chip, schematically indicating electrical power connection in prior art, and resulting electrical resistance in current flow.
Figure 5B:
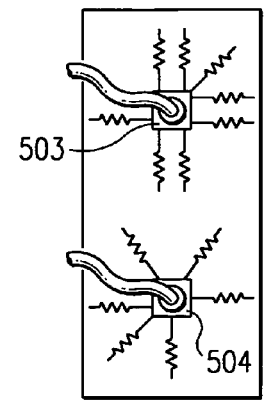
FIG. 5B is a schematic and simplified top view of a portion of an IC chip, schematically indicating electrical power connection according to the invention, and resulting electrical resistance in current flow.

A significant electrical advantage of the present invention is indicated by the comparison of FIGS. 5A and 5B. By way of example, both Figures are schematic, simplified top views of a portion of an IC chip, showing two contact pads for power supply. FIG. 5A depicts the contact pads 501 and 502 arranged in positions close to the chip periphery according to known technology, FIG. 5B depicts the two pads 503 and 504 arranged in positions over the active IC area according to the present invention. FIG. 5A indicates schematically the electrical consequences for the supply of power current caused by the remote location of the wire bonds. The current experiences lateral linear resistance, causing significant voltage drop and current de-biasing. This parasitic loss is minimized, if not altogether eliminated by the present invention.

FIG. 5B indicates schematically the electrical advantages for the supply of power current provided by the positioning of the wire bonds over the active IC area, especially when patterned into a power distribution line. As the starburst-like resistor elements indicate, the positioning of the bond pads provides a regime of sheet resistance rather than the lateral linear resistor of FIG. 5A, thus enabling a reduction of about 30 to >60% of the resistance. The voltage drop correlated with this resistance and thus the corresponding de-biasing effect are reduced and the IC performance improved.

Figure 6:
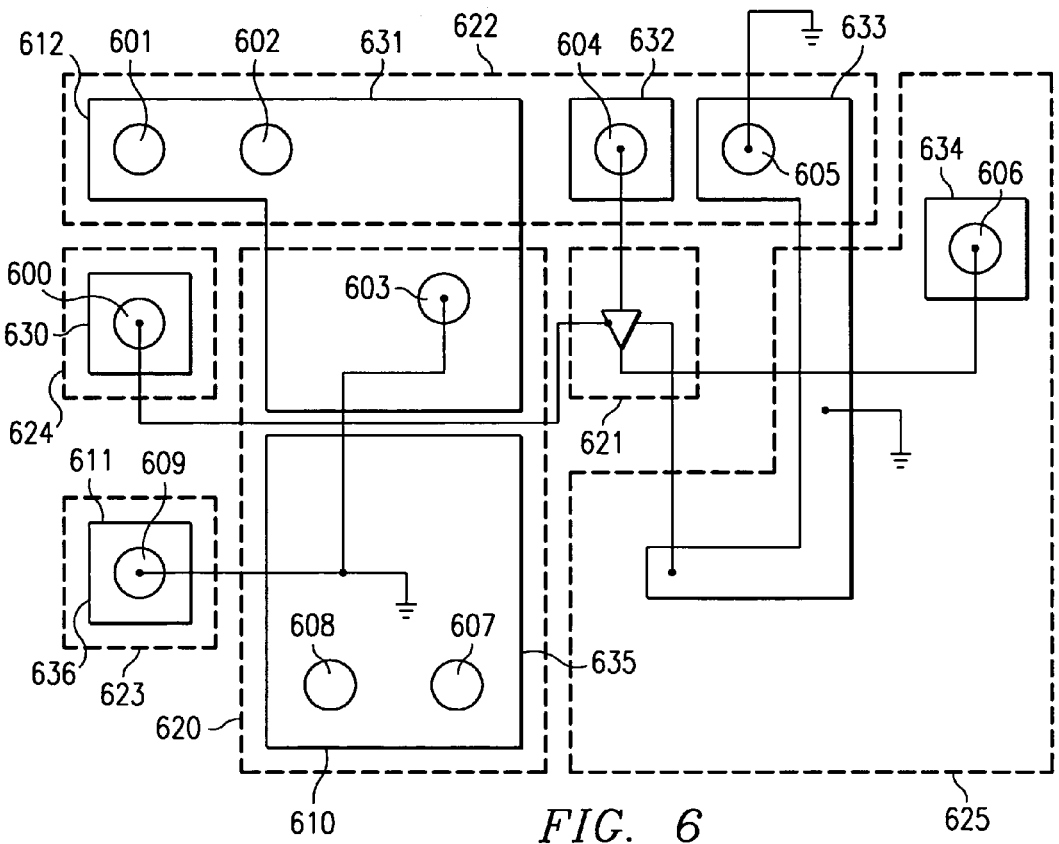
FIG. 6 is a schematic diagram of individualized power distribution lines deposited over an active IC for lowering electrical parasitics.

FIG. 6 is a schematic top view of an IC chip summarizing a general plan for geometrical layout of power distribution lines deposited over the active IC, and for the electrical features as far as they relate to lowering the electrical parasitics. The generalized IC of FIG. 6 applies the teachings of this innovation. The IC includes bond locations 600, 601, 602, 603, 604, 605, 606, 607, 608, and 609;

function blocks for:

source 610, gate 611, and drain 612;

circuit blocks (dashed outlines): 620, 621, 622, 623, 624, and 625;

network of deposited distribution lines (solid outlines): 630, 631, 632, 633, 634, 635, and 636.

The interrelation of these circuit blocks, deposited network lines, and bonds-over-active-circuit in this general diagram of FIG. 6 can be tabulated as follows:

| Circuit Block | Bond-over-active-circuit | Deposited Line |
|---|---|---|
| 620: Power Q | 603: over device "LDMOS" | 631: Power Bus |
| 621: Function block | not applicable | not applicable |
| 622: Control | 601, 602, 604 over Control Logic 605 over chip Ground | 631: Power Bus for Drain 632: Logic 633: ChipGround |
| 623: ESD/Thermal | 609: LMOS Gate | 635: Source Power Bus |
| 624: ESD/Supply | 600: Supply | 630: Supply pad |
| 625: Logic | 606: Logic out | 634: Logic out |

As the example of the general IC discussed in FIG. 6 shows, some of the deposited distribution lines may have multiple functions or possibilities:

631 and 635 illustrate dual bond-over-active-circuit and power bus functions with multiple bonds;

630, 632, 634, and 636 show usage as single bond-over-active-circuit blocks, sometimes connected to that block, but not necessarily; there could also be a remote connection.

633 illustrates bonding over non-associated circuit blocks while creating a low impedance lead for multiple chip grounding in other locations. Therefore, the connected active region could be in a remote location and interconnected with a VLSI interconnect.

It should further be mentioned that the positioning of the distribution lines and contact pads can be exploited to improve the dissipation of thermal energy released by the active components of the IC. This is especially true when solder bumps are employed as connecting means to the "outside world", minimizing the thermal path and thermal resistance for heat dissipation.

OTHER EMBODIMENTS

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention covers integrated circuits made in substrates of silicon, silicon germanium, gallium arsenide, or any other semiconductor material used in integrated circuit manufacture.

As another example, the invention covers generally a semiconductor integrated circuit which comprises a circuit structure integrating into the IC chip surface the power distribution functions of the circuit as well as the means for connecting to other parts or the "outside world". The position of the power distribution lines are selected so that they provide control and distribution of the power current to the active components preferably vertically below the distribution lines.

It is therefore intended that the appended claims encompass any such modifications or embodiments.

We claim:

1. An integrated circuit chip mounted on a leadframe, said leadframe having a plurality of segments, comprising:

a network of power distribution lines deposited on the surface of said chip over active components of said circuit;

said lines connected vertically to said components by metal-filled vias, and also to said segments by conductors; and the majority of said lines patterned as straight lines between said vias and said conductors, respectively, thereby minimizing the distance for power delivery between a selected segment and one or more corresponding active components, to which said power is to be delivered.

2. The chip according to claim 1 further having said lines fabricated with a sheet resistance of less than 1.5 mΩ/· and positioned to minimize parasitic electrical losses in power delivery between a selected segment and one or more corresponding active components, to which said power is to be delivered.

3. The chip according to claim 2 wherein said parasitic electrical losses include voltage drops during said power current flow, capacitances between said network and said active components, and inductances between network lines.

4. A semiconductor device wherein electrical parasitics are minimized by individualized power distributors deposited over active integrated circuit components, comprising:
   a semiconductor chip having first and second surfaces;
   an integrated circuit fabricated on said first chip surface, said circuit having active components, contact pads, at least one metal layer, and being protected by a mechanically strong, electrically insulating overcoat having a plurality of metal-filled vias to contact said at least one metal layer;
   electrically conductive films deposited on said overcoat and patterned into a network of lines substantially vertically over said active components, said films in contact with said vias and having an outermost film of non-corrodible, metallurgically attachable metal;
   said network patterned to distribute power current while minimizing parasitic electrical losses between said network and said active components;
   said network further patterned to minimize silicon real estate consumed by power interconnections between said active components;
   a leadframe having a chip mount pad, a first plurality of segments providing electrical signals, and a second plurality of segments providing electrical power and ground;
   said second chip surface attached to said chip mount pad;
   electrical conductors connecting said contact pads with said first plurality of segments; and
   electrical conductors connecting said network lines with said second plurality of segments.

5. The device according to claim 4 wherein said chip is selected from a group consisting of silicon, silicon germanium, gallium arsenide, and any other semiconductor material customarily used in electronic device fabrication.

6. The device according to claim 4 wherein said integrated circuit comprises multi-layer metallization, at least one of said layers made of pure or alloyed copper, aluminum, nickel, or refractory metals.

7. The device according to claim 4 wherein said overcoat comprises materials selected from a group consisting of silicon nitride, silicon oxynitride, silicon carbon alloys, polyimide, and sandwiched films thereof.

8. The device according to claim 4 wherein said leadframe is pre-fabricated from a sheet-like material selected from a group consisting of copper, copper alloy, aluminum, iron-nickel alloy, or invar.

9. The device according to claim 4 wherein said device includes an encapsulation comprising a polymer compound fabricated in a transfer molding process.

10. The device according to claim 4 wherein said lines and contact pads are attached to outside parts by solder balls.

11. The device according to claim 4 wherein said conductive films comprise a stack of stress-absorbing metal films under said outermost metallurgically attachable film.

12. The device according to claim 11 wherein said stack of films comprise a layer of seed metal, promoting adhesion to said vias and inhibiting migration of overlying metals to said vias, at least one stress- absorbing metal layer, and an outermost metallurgically attachable metal layer.

13. The device according to claim 12 wherein said seed metal is selected from a group consisting of tungsten, titanium, titanium nitride, molybdenum, chromium, and alloys thereof.

14. The device according to claim 12 wherein said stress-absorbing metal layer comprises at least one layer selected from a group consisting of copper, nickel, aluminum, and alloys thereof.

15. The device according to claim 12 wherein said outermost metal layer is selected from a group consisting of pure or alloyed aluminum, gold, palladium, silver and platinum.

16. The device according to claim 4 wherein said electrical conductors are selected from a group comprising wire ball and stitch bonding, ribbon bonding, and soldering.

17. The device according to claim 4 wherein said conductors are bonding wires, bonding ribbons, or solder balls.

18. The device according to claim 17 wherein said bonding wire is selected from a group consisting of pure or alloyed gold, copper, and aluminum.

19. The device according to claim 17 wherein said solder ball is selected from a group consisting of pure tin, tin alloys including tin/copper, tin/indium, tin/silver, tin/bismuth, tin/lead, and conductive adhesive compounds.

20. The device according to claim 4 wherein said network of lines is electrically further connected to selected segments suitable for outside electrical contact.

21. An integrated circuit chip mounted on a leadframe, said leadframe having a plurality of segments, comprising:
   a network of power distribution lines deposited on the surface of said chip over active components of said circuit;
   said lines comprising a stack including a stress-absorbing metal film;
   said lines connected vertically to said components by metal-filled vias, and also to said segments by conductors; and
   the majority of said lines patterned as straight lines between said vias and said conductors.

22. The device of claim 21, wherein said stack including a stress-absorbing metal film comprises an outermost metallurgically attachable film.

23. The device of claim 21, wherein said stack including a stress-absorbing metal film comprises a layer of seed metal, a stress-absorbing metal layer on said seed metal layer, and an outermost metallurgically attachable metal layer.

24. The device of claim 23, wherein said stress-absorbing metal layer comprises at least one layer selected from a group consisting of copper, nickel, aluminum, and alloys thereof.

25. The device of claim 23, wherein said seed metal is selected from a group consisting of tungsten, titanium, titanium nitride, molybdenum, chromium, and alloys thereof.

26. The device according to claim 23, wherein said outermost metal layer is selected from a group consisting of pure or alloyed aluminum, gold, palladium, silver and platinum.

* * * * *